United States Patent
Park

(10) Patent No.: US 7,274,039 B2
(45) Date of Patent: Sep. 25, 2007

(54) DUAL PANEL TYPE ORGANIC ELECTROLUMINESCENT DISPLAY DEVICE AND METHOD OF FABRICATING THE SAME

(75) Inventor: Jae-Yong Park, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 295 days.

(21) Appl. No.: 11/022,764

(22) Filed: Dec. 28, 2004

(65) Prior Publication Data

US 2005/0142977 A1    Jun. 30, 2005

(30) Foreign Application Priority Data

Dec. 29, 2003   (KR) .................... 10-2003-0098683

(51) Int. Cl.
*H01L 29/04* (2006.01)
*H01L 21/00* (2006.01)

(52) U.S. Cl. ............................ 257/72; 257/80; 257/83; 257/84; 438/22; 438/24; 438/82

(58) Field of Classification Search ................. 438/22, 438/24, 29, 30, 82, 99; 257/40, 72, 80, 83, 257/84
See application file for complete search history.

(56) References Cited

U.S. PATENT DOCUMENTS

| 6,798,132 B2 * | 9/2004 | Satake ................... 313/495 |
| 2004/0100191 A1 * | 5/2004 | Park ...................... 313/506 |
| 2004/0135496 A1 * | 7/2004 | Park et al. ................ 313/504 |

* cited by examiner

*Primary Examiner*—Hsien-Ming Lee
(74) *Attorney, Agent, or Firm*—Morgan, Lewis & Bockius LLP

(57) ABSTRACT

A method of fabricating a substrate for an organic electroluminescent display device includes forming a first electrode on a substrate in a pixel region and a non-pixel region, the first electrode including a first conductive material, forming an auxiliary electrode on the first electrode in the non-pixel region, the auxiliary electrode including a second conductive material and contacting the first electrode, the first and second conductive materials being different from one another, forming a bank corresponding to the auxiliary electrode, the bank surrounding the pixel region, forming an organic electroluminescent layer on the first electrode, the organic electroluminescent layer in the pixel region surrounded by the bank, and forming a second electrode on the organic electroluminescent layer, the second electrode corresponding to the organic electroluminescent layer.

23 Claims, 11 Drawing Sheets emission direction

DUAL PANEL TYPE ORGANIC ELECTROLUMINESCENT DISPLAY DEVICE AND METHOD OF FABRICATING THE SAME

The present application claims the benefit of Korean Patent Application No. 2003-0098683 filed in Korea on Dec. 29, 2003, which is hereby incorporated by reference.

BACKGROUND OF THE INVENTION

1. Field of the Invention

The present invention relates to a display device, and more particularly, to a dual panel type organic electroluminescent (EL) display device and a method of fabricating the same.

2. Discussion of the Related Art

Among flat panel displays (FPDs), organic electroluminescent (EL) display devices have been of particular interests in research and development because they are light-emitting type displays having superior brightness, wide viewing angle and high contrast ratio. In particular, an organic EL display device is a self-luminous device and does not need an additional light source to emit light. Accordingly, an organic EL display device has a very thin profile and light weight.

In addition, the organic EL display device can be operated using a low direct-current (DC) voltage, thereby having low power consumption and fast response time. Further, the organic EL display device is an integrated device, such that it has high endurance of external impacts, a large operational temperature range and a wide range of applications. Moreover, the organic EL display device generally is manufactured using a relatively simple process including a deposition process and an encapsulation process. Thus, an organic EL display device has a low production cost.

An active matrix type organic EL display device includes thin film transistors as switching elements within each pixel. The voltage applied to the pixels are charged in a storage capacitor Cst so that the voltage can be applied until the next frame signal is applied, thereby continuously driving the organic EL display device regardless of the number of gate lines until a picture of images is finished. Accordingly, the active matrix type organic EL display device provides uniform luminescence, even when a low current is applied and the display area is large.

FIG. 1 is a schematic cross-sectional view of an organic EL display device according to the related art. In FIG. 1, an organic EL display device includes first and second substrates 10 and 60 facing each other and spaced apart from each other. An array element layer AL is formed on the first substrate 10 and includes a thin film transistor (TFT) T. Although not shown, the array element layer AL further includes a gate line, a data line crossing the gate line to define a pixel region P, and a power line crossing one of the gate and data lines. In addition, a first electrode 48, an organic electroluminescent (EL) layer 54 and a second electrode 56, which constitute an organic EL diode DEL, are sequentially formed on the array element layer AL. The first electrode 48 is connected to the TFT T.

In addition, the second substrate 60 functions as an encapsulating panel having a receded portion 62. A desiccant 64 is packaged in the receded portion 62 to protect the organic EL display device from moisture. A seal pattern 70 is formed between the first and second substrates 10 and 60 in a periphery thereof. With the seal pattern 70, the first and second substrates 10 and 60 are attached to each other.

Accordingly, the organic EL display device according to the related art emits light from the organic EL diode $D_{EL}$ toward the array element layer AL and away from the second substrate 60.

FIG. 2A is a schematic plan view of a pixel region of the organic EL display device shown in FIG. 1. As shown in FIG. 2A, a gate line 22 crosses a data line 42 and a power line 28, and the data line 42 and the power line 28 are spaced apart from each other. The pixel region P is defined by the gate line 22 and the data line 42. A switching TFT $T_S$ is located adjacent to the crossing of the gate line 22 and the data line 42. A driving TFT $T_d$ is connected to the switching TFT $T_S$ and the power line 28. A storage capacitor $C_{ST}$ uses a portion of the power line 28 as a first capacitor electrode and an active pattern 16 extending from an active layer 31 of the switching TFT $T_S$ as a second capacitor electrode. The first electrode 48 is connected to the driving TFT $T_d$. The switching TFT $T_S$ and the driving TFT $T_d$ constitute a TFT T. Although not shown, the organic EL layer 54 and the second electrode 56 (shown in FIG. 1) are sequentially formed on the first electrode 48.

FIG. 2B is a schematic cross-sectional view along II-II of FIG. 2A. As shown in FIG. 2B, the driving TFT $T_d$ including an active layer 14, a gate electrode 20, source electrode 38, and drain electrode 40 is formed on the first substrate 10. The source electrode 38 connects to the power line 28 through a power electrode 26 that is connected to the power line 28, and the drain electrode 40 connects to the first electrode 48. The active pattern 16 is formed with the same material as the active layer 14 and is formed under the power line 28 having conductivity. The active pattern 16 and the power line 28 constitute the storage capacitor $C_{ST}$. The organic EL layer 54 and the second electrode layer 56 are sequentially formed on the first electrode 48. The first electrode 48, the organic EL layer 54, and the second electrode 56 constitute the organic EL diode $D_{EL}$.

In addition, a first insulating layer 12 is formed between the first substrate 10 and the active layer 14 as a buffer layer. A second insulating layer 18 is formed between the active layer 14 and the gate electrode 20 as a gate insulating layer. A third insulating layer 24 is formed between the active pattern 16 and the power line 28. A fourth insulating layer 30 is formed between the power line 28 and the source electrode 38. A fifth insulating layer 44 is formed between the drain electrode 40 and the first electrode 48. A sixth insulating layer 50 is formed between the first electrode 48 and the second electrode 56. The third to sixth insulating layers 24, 30, 44 and 50 include contact holes for electric connections of the respective electrodes.

In the organic EL display device according to the related art, the array element layer having TFTs and the organic electroluminescent (EL) diode are formed on the first substrate, and the second substrate is attached to the first substrate for encapsulation. However, when the array element layer having TFTs and the organic EL diode are formed on one substrate, production yield of the organic EL display device is determined by a multiplication of the array element layer's yield and the organic EL diode's yield. In particular, because the yield of the organic EL diode is relatively low, the production yield of the overall EL display device is limited by the yield of the organic EL diode. For example, even when TFTs are well fabricated, an organic EL display device using a thin film of about 1000 Å thickness can be determined to be defective due to a defect of an organic emission layer. This results in loss of materials and high production costs.

In addition, organic EL display devices are classified into bottom emission type and a top emission type based on a direction of light emitted from the organic EL diodes. The bottom emission type organic EL display devices have advantages such as high encapsulation stability and high process flexibility. However, the bottom emission type organic EL display devices are ineffective for high resolution devices because they have a low aperture ratio.

In contrast, the top emission organic EL display devices have a higher expected life span because they are more easily designed and have a high aperture ratio. However, in the top emission type organic EL display devices, the cathode is generally formed on an organic emission layer. As a result, transmittance and optical efficiency of the top emission type organic EL display devices are reduced because of a limited number of materials that can be selected. Further, when a thin film passivation layer is formed to avoid the reduction of light transmittance, the thin film passivation layer may fail to block infiltration of exterior air into the device.

SUMMARY OF THE INVENTION

Accordingly, the present invention is directed to a dual panel type organic electroluminescent display device and a method of fabricating the same that substantially obviate one or more of the problems due to limitations and disadvantages of the related art.

An object of the present invention is to provide an organic EL display device having an improved production yield by reducing a production cost through a simplified process, a high resolution and a high aperture ratio. An organic EL display device according to an embodiment of the present invention is a dual panel type such that an array element layer having TFT and an organic EL diode are formed on their respective substrates.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a method of fabricating an organic electroluminescent display device includes depositing and patterning a transparent conductive material on a first surface of a first substrate to form a first electrode in a pixel region and a non-pixel region, depositing and patterning an opaque conductive material on the first surface of the first substrate to form an auxiliary electrode on the first electrode in the non-pixel region, depositing a first insulating material on the first surface of the first substrate, using the auxiliary electrode as a mask and irradiating light onto a second surface of the first substrate to pattern the first insulating material to form a bank, the first and second surfaces of the first substrate being opposing surfaces to one another, forming an organic electroluminescent layer on the first surface of the first substrate, the organic electroluminescent layer being in the pixel region surrounded by the bank, and forming a second electrode on the first surface of the first substrate, the second electrode corresponding to the organic electroluminescent layer.

In another aspect, a method of fabricating a substrate for an organic electroluminescent display device includes forming a first electrode on a substrate in a pixel region and a non-pixel region, the first electrode including a first conductive material, forming an auxiliary electrode on the first electrode in the non-pixel region, the auxiliary electrode including a second conductive material and contacting the first electrode, the first and second conductive materials being different from one another, forming a bank corresponding to the auxiliary electrode, the bank surrounding the pixel region, forming an organic electroluminescent layer on the first electrode, the organic electroluminescent layer in the pixel region surrounded by the bank, and forming a second electrode on the organic electroluminescent layer, the second electrode corresponding to the organic electroluminescent layer.

In yet another aspect, an organic electroluminescent display device includes a first electrode of a transparent conductive material on a first substrate in a pixel region and a non-pixel region, an auxiliary electrode contacting the first electrode in the non-pixel region, the auxiliary electrode including an opaque metallic material, a bank of an insulating material corresponding to the auxiliary electrode, the bank surrounding the pixel region, an organic electroluminescent layer in the pixel region surrounded by the bank; and a second electrode on the organic electroluminescent layer, the second electrode corresponding to the organic electroluminescent layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
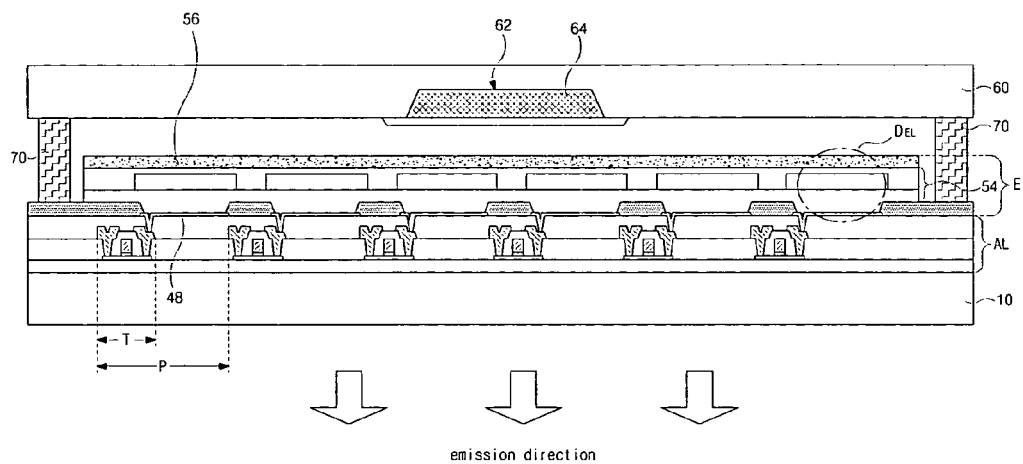
FIG. 1 is a schematic cross-sectional view of an organic EL display device according to the related art.
Figure 2A:
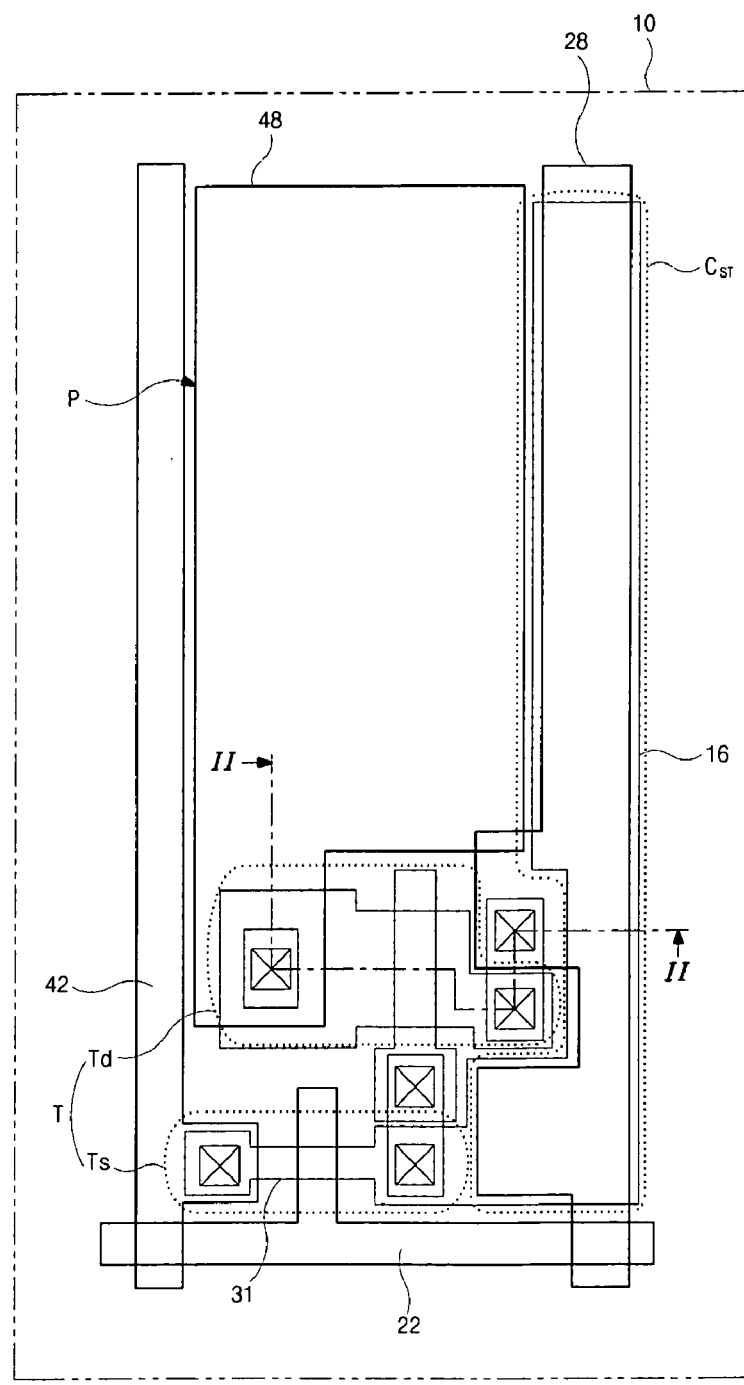
FIG. 2A is a schematic plan view of a pixel region of the organic EL display device shown in FIG. 1.
Figure 2B:
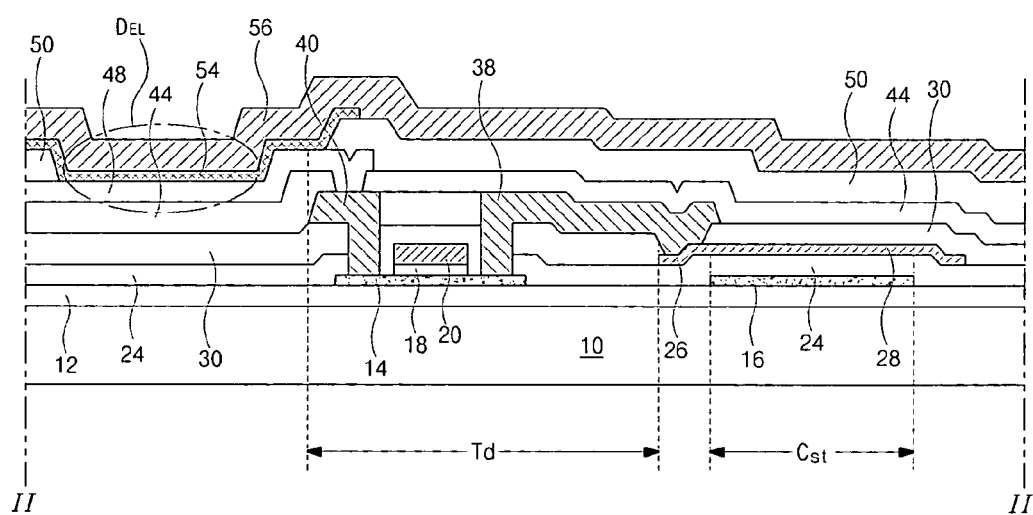
FIG. 2B is a schematic cross-sectional view along II-II of FIG. 2A.
Figure 3:
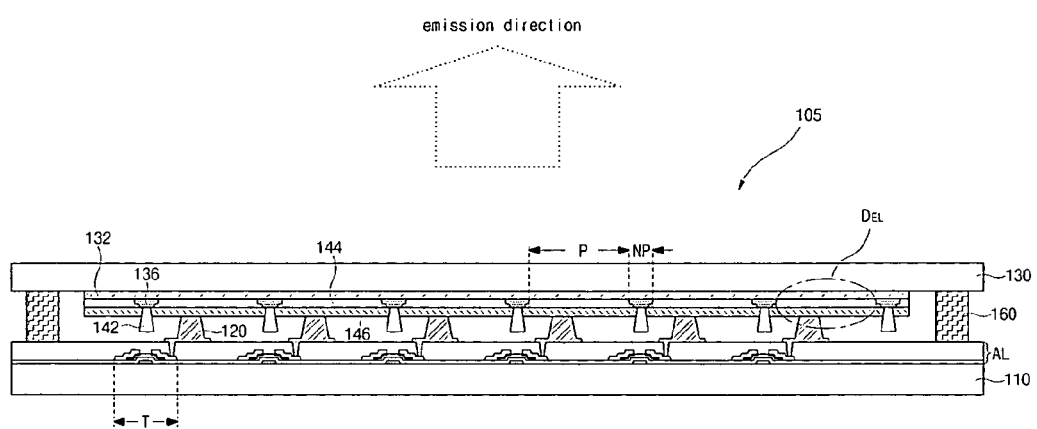
FIG. 3 is a schematic cross-sectional view of a dual panel type organic EL display device according to an embodiment of the present invention.

FIG. 3 is a schematic cross-sectional view of a dual panel type organic EL display device according to an embodiment of the present invention. In FIG. 3, an organic EL display device 105 includes first and second substrates 110 and 130 attached to each other by a seal pattern 160 in a periphery region with a predetermined space therebetween. The EL display device 105 also includes a plurality of pixel regions P and a non-pixel region NP. The pixel regions P may correspond to minimum regions for image display, and the non-pixel region NP may be the boundary of the pixel regions P.

In addition, the first substrate 110 includes an array element layer AL having a plurality of thin film transistors (TFTs) T, and a plurality of connection electrodes 120 formed on the array element AL. The connection electrode 120 connects to the TFT T and may be formed as a multi-layer including an organic insulating pattern having a predetermined height. Although not shown, the array element layer AL includes gate lines, data lines crossing the gate lines to define the pixel regions P, and power lines crossing one of the gate and data lines. Further, the TFT T may include switching TFT that controls a voltage from the gate and data lines, and driving TFT that controls a brightness using a voltage from a respective the switching TFT and the power line. For instance, the TFT T connected to the connection electrode 120 may be the driving TFT.

Further, the second substrate 130 includes a first electrode 132, an interlayer 136 and a separator 142. The first electrode 132 may formed directly on the second substrate 130 both in the pixel regions P and the non-pixel region NP. In particular, the interlayer 136 and separator 142 may be formed in the non-pixel region NP. The separator 142 may have a width that gradually increases from a portion near the second substrate 130 to a portion further away from the second substrate 130, such that the separator 142 has a trapezoid cross-sectional shape and has an inverted taper with respect to the second substrate 130. The separator 142 may divide the pixel regions P from one another.

The second substrate 130 further includes an organic EL layer 144 and a second electrode 146 formed on the first electrode 132 in the pixel regions P. In particular, the interlayer 136 is formed to prevent the first electrode 132 and the second electrode 146 from shorting at a side portion of the separator 142. Further, the second electrode 146 electrically connects to the connection electrode 120, such that the second electrode 146 and the TFT T are electrically connected to each other.

The first electrode 132, the organic EL layer 144 and the second electrode 146 may constitute an organic EL diode $D_{EL}$. When the organic EL display device 105 is a top emission type emitting light from the organic EL diode $D_{EL}$ toward the first electrode, the first electrode 132 is formed of a transparent conductive material. For example, when the first electrode 132 functions as an anode and the second electrode 146 functions as a cathode, the first electrode 132 may include one of indium-tin-oxide (ITO), indium-zinc-oxide (IZO) and indium-tin-zinc-oxide (ITZO).

Accordingly, the array element layer AL and the organic EL diode $D_{EL}$ are formed on different substrates, thereby increasing product yield and efficiency of the organic EL display device 105. In addition, the overall design of the array layer including TFTs is simplified. When the dual panel type organic EL display device is a top emission type, it further has such advantages as a high aperture ratio, a high resolution and a long expected life span. Moreover, because the organic EL layer and the second electrode are spaced by the separator without an additional mask, a production yield is higher.

However, the first electrode 132 is formed of a transparent conductive material, such as ITO, which generally has a higher resistivity than metallic materials. Thus, to improve the conductivity of an anode of an organic EL display device, the organic EL display device may have the configuration including an auxiliary first electrode as shown in FIGS. 4A and 4B.

Further, when the organic EL layer is made of a poly type emitting material, an ink-jet method may be utilized to form the organic EL layer. However, because an ink of the color emitting material may cohere to edges of the separator, the organic EL display device may have a bank having a normal taper, instead of the separator having the inverted taper, as shown in FIGS. 4A and 4B.

Figure 4A:
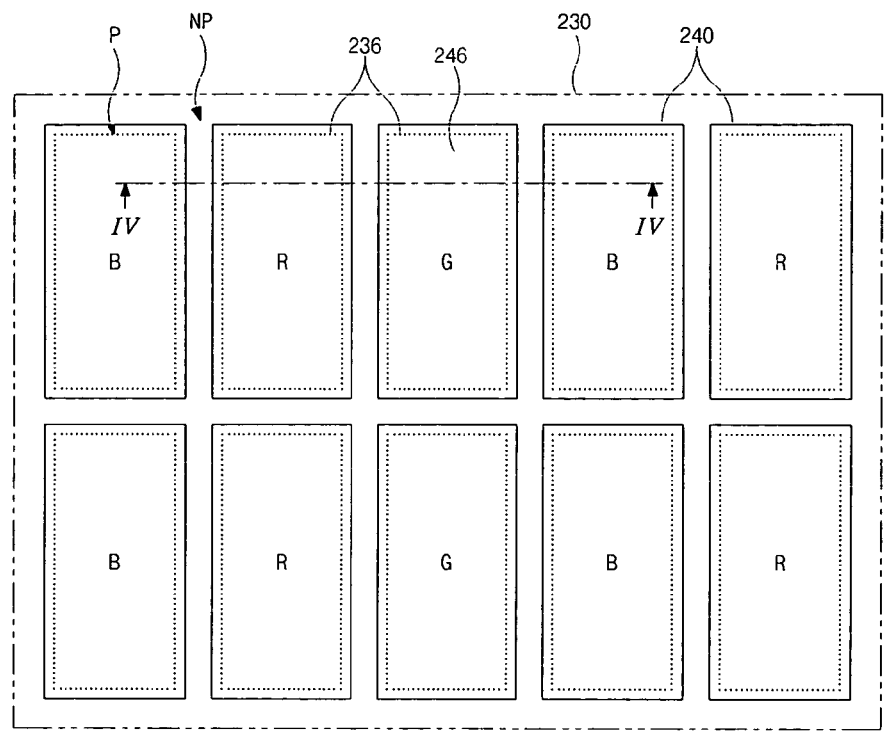
FIG. 4A is schematic plan view of a substrate for a dual panel type organic EL display device according to an embodiment of the present invention.

FIG. 4A is schematic plan view of a substrate for a dual panel type organic EL display device according to an embodiment of the present invention. In FIG. 4, an organic EL display device includes a substrate 230. The substrate 230 includes a plurality of pixel regions P and a non-pixel region NP. The pixel regions P may correspond to minimum regions for image display, and the non-pixel region NP may be the boundary of the pixel regions P. The substrate 230 also includes a bank 240 corresponding to the pixel regions P. An interlayer 236 may surround the bank 240 and a second electrode 246 may be divided by the bank 240.

Figure 4B:
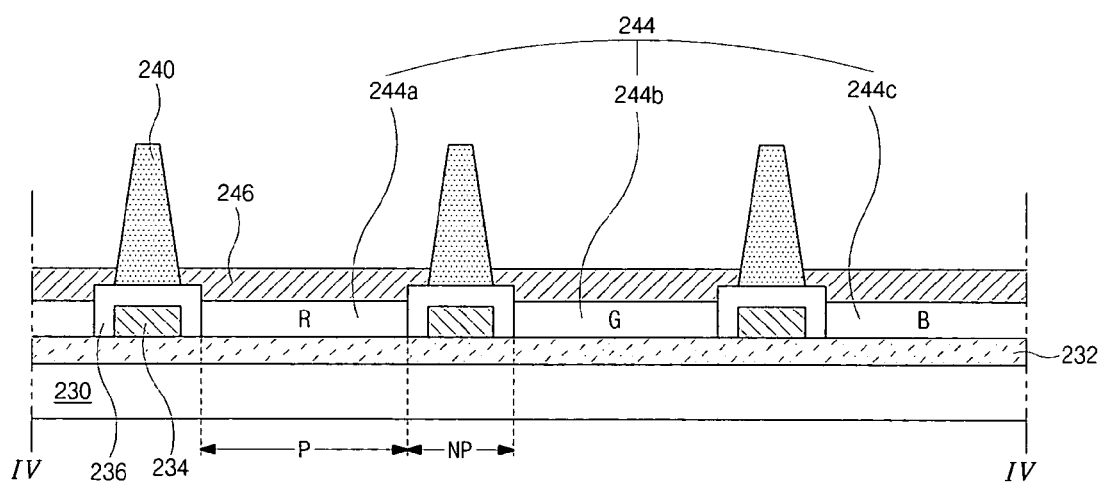
FIG. 4B is a schematic cross-sectional view along IV-IV of FIG. 4A.

FIG. 4B is a schematic cross-sectional view along IV-IV of FIG. 4A. As shown in FIG. 4B, the substrate 230 also includes a first electrode 232. The first electrode 232 may be formed of one of transparent conductive materials such as ITO, IZO and ITZO. Further, the first electrode 232 may formed directly on the substrate 230 both in the pixel regions P and the non-pixel region NP.

In addition, an auxiliary first electrode 234 may be formed on the first electrode 232 within the non-pixel region NP. A width of the auxiliary first electrode 234 may be smaller than a width of the non-pixel region NP, and the auxiliary first electrode 234 may be formed of an opaque metallic material having a lower resistivity than the first electrode 232. By forming the auxiliary first electrode 234 in the non-pixel region NP, transmittance of the first electrode 232 is not affected or dropped by the auxiliary first electrode 234 while resistivity of the first electrode 232 is reduced due to its contact with the auxiliary first electrode 234. Further, when the auxiliary first electrode 234 is formed of the opaque metallic material, the auxiliary first electrode 234 may function as a black matrix, such that an additional black matrix layer is not needed.

Further, the interlayer 236 may cover the auxiliary first electrode 234. In particular, the interlayer 236 may encapsulate the auxiliary first electrode 234, and may be formed of an insulating material. For instance, the interlayer 236 may be a single layer having an open portion (not shown) corresponding to the pixel regions P and having a width corresponding to the width of the non-pixel region NP.

Moreover, the bank 240 may be formed above the auxiliary first electrode 234 and has a predetermined height. In particular, the bank 240 may be formed on the interlayer 236 and may have a first width near the substrate 230 being larger than a second width further away from the substrate 230. For instance, the bank 240 may have a gradually decreasing width as it extends away from the substrate 230. Further, the bank 240 may surround the pixel regions P.

In addition, an organic EL layer 244 is formed on the first electrode 232 in the pixel regions P. In particular, the organic EL layer 244 may be divided by the auxiliary first layer 234 and the interlayer 236. Further, the organic EL layer 244 may include red, green and blue EL layers 244a, 244b and 244c. The red, green and blue EL layers 244a, 244b and 244c may comprise a poly type emitting material of a respective color.

Although not shown, the organic EL layer 244 preferably may have a varying thickness. For instance, a first thickness of the organic EL layer 244 edging the bank 240 may be different from a second thickness of the organic EL layer 244 in a center portion of the pixel regions P. Therefore, the bank 240 is preferably formed within the non-pixel region NP similar to the interlayer 236, thereby providing improved image quality. Consequently, the auxiliary first electrode 234 and the bank 240 are formed corresponding to each other.

The second electrode 246 is formed on the organic EL layer 244. Specifically, because the bank 240 has a non-inverted taper structure in contrast with the separator 142 (shown in FIG. 3), the second electrode 246 may be formed on an entire surface along steps of the bank 240. Therefore, removing a portion of a second electrode material (not shown) covering the bank 240 may be performed in some cases.

Accordingly, the combination of the first electrode 232 and the auxiliary first electrode 234 may function as an anode of the organic EL display device. In particular, since the auxiliary first electrode 234 has a lower resistivity than the first electrode 232, the combined resistivity of the first electrode 232 and the auxiliary first electrode 234 is lower than the first electrode 232 by itself. Thus, the organic EL display device according to an embodiment of the present invention has an anode with improved conductivity.

Further, since the auxiliary first electrode 234 is formed of the opaque metallic material, the auxiliary first electrode 234 may function as a black matrix, such that an additional black matrix layer is not needed.

Figure 5A:
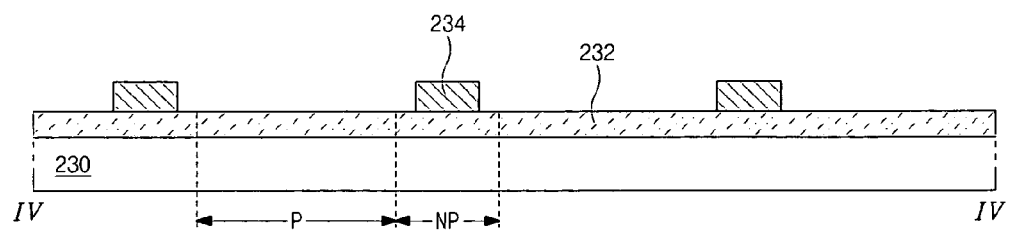
FIGS. 5A to 5E are schematic process views of a method of fabricating a dual panel type organic EL display device according to an embodiment of the present invention.

FIGS. 5A to 5E are schematic process views of a method of fabricating a dual panel type organic EL display device according to an embodiment of the present invention. In FIG. 5A, a first electrode 232 is formed on a substrate 230. The first electrode 232 may formed directly on the substrate 230 both in pixel regions P and a non-pixel region NP. In addition, an auxiliary first electrode 234 is formed on the first electrode 232 within the non-pixel region NP by a first mask process. Although not shown, the first mask process includes exposing, developing and etching processes. Further, the auxiliary first electrode 234 may be formed using an opaque metallic material having a lower resistivity than the first electrode 232. For example, the auxiliary first electrode 234 may comprise one of molybdenum (Mo), tungsten (W), and chromium (Cr).

Figure 5B:
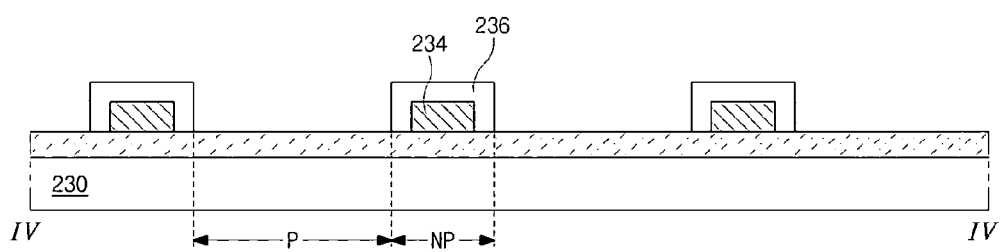

In FIG. 5B, an interlayer 236 is formed to cover the auxiliary first electrode 234 in the non-pixel region NP by a second mask. Although not shown, the second mask process includes exposing, developing and etching processes. The interlayer 236 may be formed using a first insulating material and the interlayer 236 may have an open portion (not shown) exposing the pixel regions P. Thus, the interlayer 236 may encapsulate the auxiliary first electrode 234 and insulate the auxiliary first electrode 234 from conductive materials subsequently formed thereon.

Figure 5C:
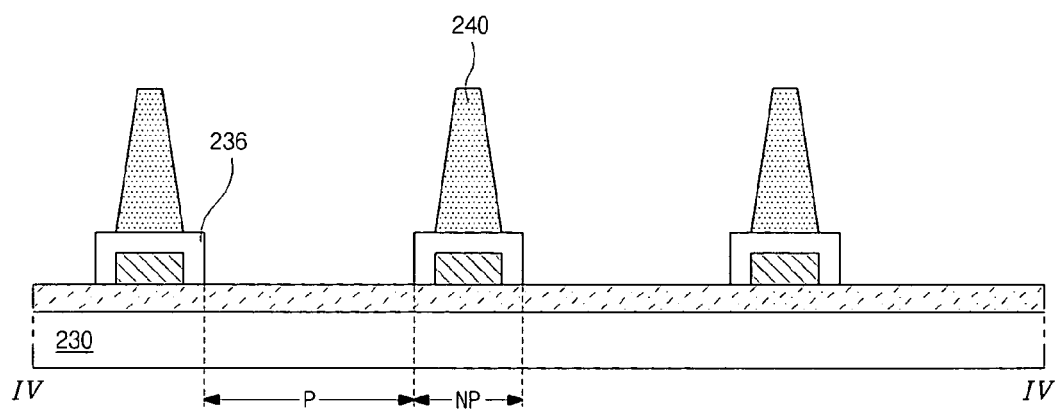

In FIG. 5C, a bank 240 is formed on the interlayer 236 within the non-pixel region NP by a third mask process. Although not shown, the third mask process includes exposing, developing and etching processes. Similar to the interlayer 236, the bank 240 may have the same open portion exposing the pixel regions P. In addition, the bank 240 may be formed using a second insulating material. For example, the bank 240 may comprise an organic material having a thick thickness such as photosensitive material. If a photosensitive material is employed, the third mask process can be performed without adding a photoresist material. Further, the bank 240 may have the same width as the auxiliary first electrode 234, and the mask used in the first mask process for forming the auxiliary first electrode 234 may be reused to expose the second insulating material to form the bank 240.

Figure 5D:
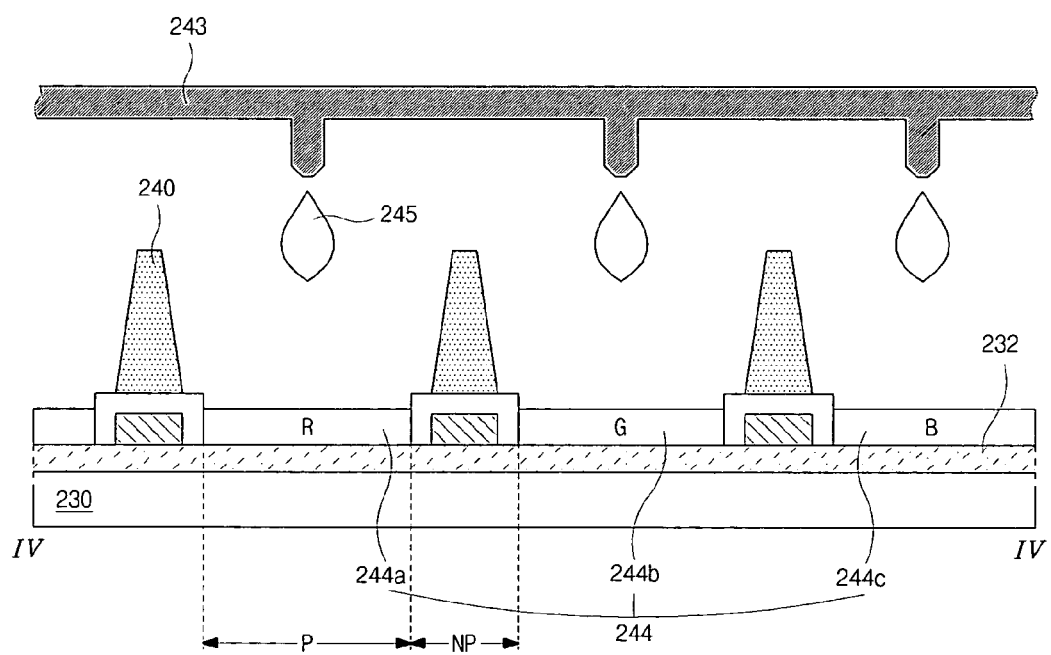

In FIG. 5D, an organic EL layer 244 is formed on the first electrode 232 surrounded by the bank 240. Specifically, the organic EL layer 244 may be formed by dispensing red, green and blue EL materials 245 on the first electrode 232 and forming red, green and blue EL layers 244a, 244b and 244c in the pixel regions P. The red, green and blue EL materials 245 may include ink type poly-emitting materials. For example, the step of dispensing the red, green and blue EL materials 245 may be simultaneously performed or may be sequentially performed in a repeating manner using an ink-jet nozzle apparatus 243. In particular, the organic EL layer 244 may have a thickness smaller than a thickness of the interlayer 236.

Figure 5E:
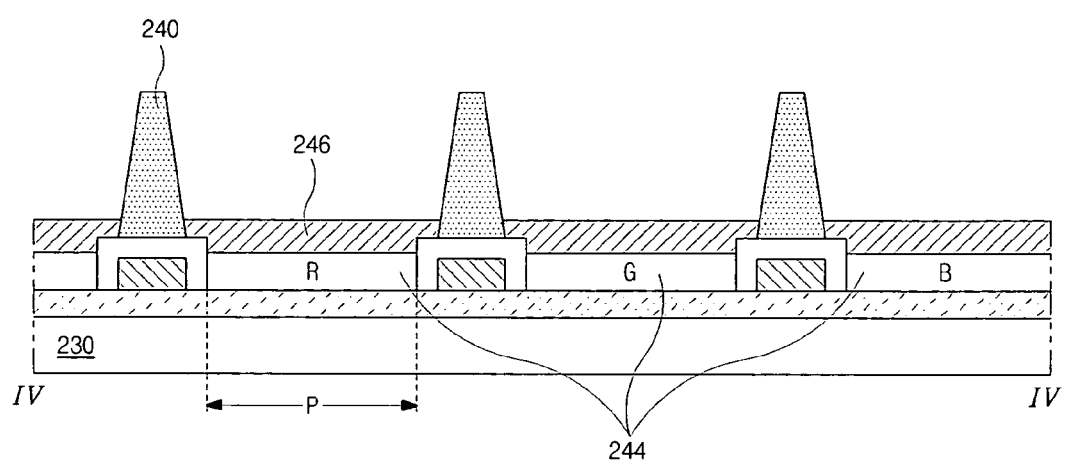

In FIG. 5E, a second electrode 246 is formed on the organic EL layer 244. Before the step of forming the second electrode 246, a second electrode material (not shown) is further formed on an entire surface of the bank 240. For example, a portion of the second electrode material covering the bank 240 may be removed without a mask process.

Accordingly, the method of fabricating the second substrate having the organic EL diode, the auxiliary first electrode, the interlayer, and the bank of an embodiment of the present invention includes a simplified mask process.

Figure 6A:
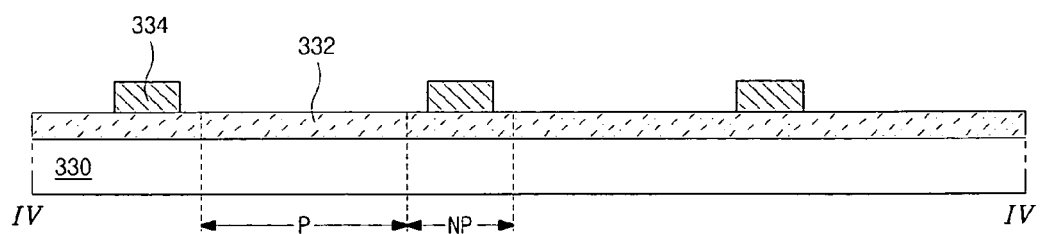
FIGS. 6A to 6E are schematic process views of a method of fabricating a dual panel type organic EL display device according to another embodiment of the present invention.
Figure 6B:
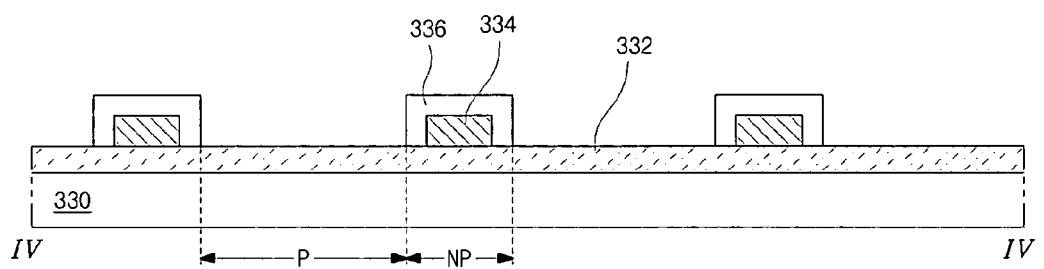

FIGS. 6A to 6E are schematic process views of a method of fabricating a dual panel type organic EL display device according to another embodiment of the present invention. In FIGS. 6A and 6B, a first electrode 332 is formed on a substrate 330, an auxiliary first electrode 334 is formed on the first electrode 332, and an interlayer 336 covers the auxiliary first electrode 334. The first electrode 332 may formed directly on the substrate 330 both in pixel regions P and a non-pixel region NP, and the auxiliary first electrode 334 may be formed on the first electrode 332 within the non-pixel region NP by a first mask process.

In particular, the auxiliary first electrode 334 may comprise one of metallic materials excluding aluminum (Al) based materials to prevent galvanic phenomenon with a transparent material of the first electrode 332. For example, the auxiliary first electrode 334 may comprise one of metallic materials having a high chemical corrosion resistance such as molybdenum (Mo), tungsten (W), and chromium (Cr). In addition, the interlayer 336 may be formed using a first insulating material having an open portion (not shown) exposing the pixel regions P by a second mask process.

Figure 6C:
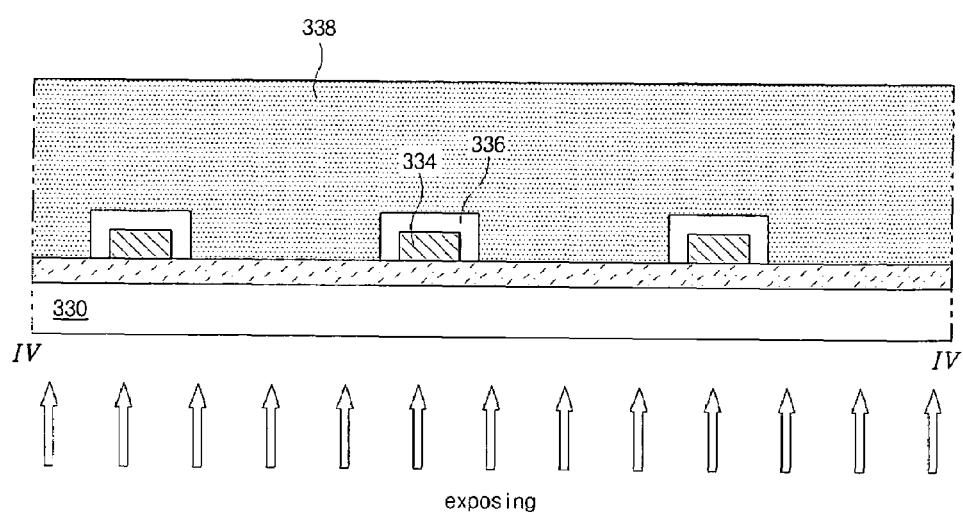

In FIG. 6C, a photosensitive material layer 338 is formed on an entire surface of the substrate 330 and the photosensitive material layer 338 is exposed to light irradiated through a backside of the substrate 330. In particular, the photosensitive material layer 338 may comprise a positive type such that a portion after being exposed to light is removed by a developing process. As a result, a portion of the photosensitive material layer 338 corresponding to the auxiliary first electrode 334 is not exposed to the irradiating light and remains above the auxiliary first electrode 334 after a developing process. Accordingly, an additional mask may be needed to pattern the photosensitive material layer 338.

Figure 6D:
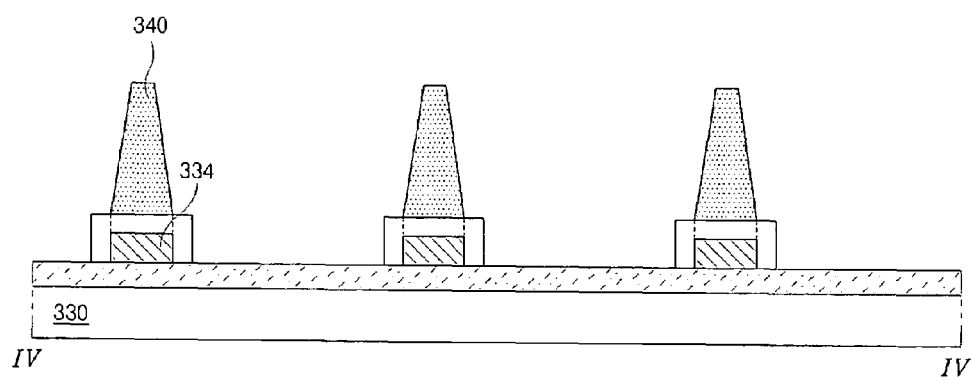

In FIG. 6D, the photosensitive material layer 338 (of FIG. 6C) is patterned into a bank 340 after a developing processing. In particular, a base width of the bank 340 is the same as the width of the auxiliary first electrode 334. Further, the bank 340 may have a non-inverted taper in its width due to the ratio of the height of the photosensitive material layer 338 and the width of the mask, e.g., the auxiliary first electrode 334. As a result, the bank 340 surrounds the pixel regions P.

Figure 6E:
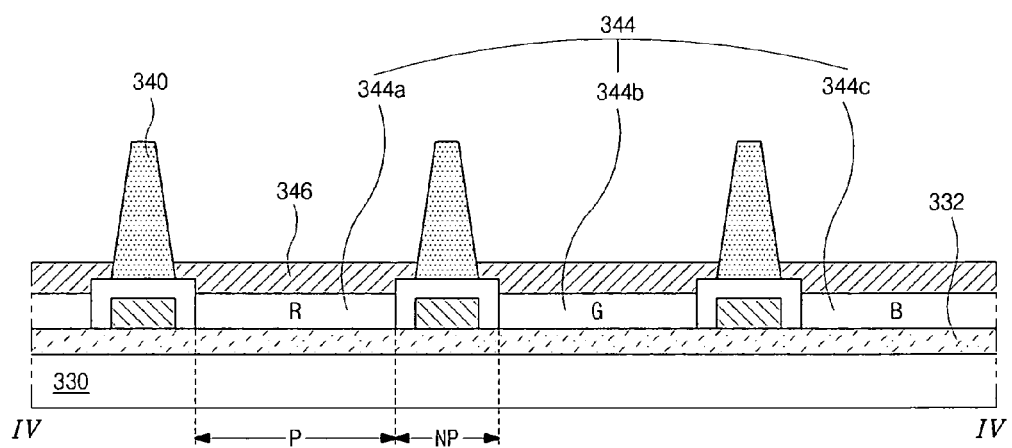

In FIG. 6E, an organic EL layer 344 is formed on the first electrode 332 in the pixel regions P. In particular, the organic EL layer 344 includes red, green and blue EL layers 344a, 344b and 344c in the pixel regions P. The organic EL layer 344 may be formed using an ink-jet printing process. In addition, a second electrode 346 is formed on the organic EL layer 344 in the pixel regions P. As a result, the first electrode 332 may function as a anode electrode and the second electrode 346 may be as a cathode electrode of the organic EL display device.

The substrate 230 shown in FIGS. 4A and 4B may be formed by the fabrication method shown in FIGS. 5A to 5E or by the fabrication method shown in FIGS. 6A to 6E. In addition, although not shown, a method of fabricating an organic electroluminescent device according to the present invention may further include forming an array element having a thin film transistor on another substrate, and forming a connection electrode on the array element, the connection electrode connected to the thin film transistor.

Accordingly, the method of fabricating the second substrate having the organic EL diode, the auxiliary first electrode, the interlayer, and the bank of an embodiment of the present invention includes a simplified mask process.

Figure 7:
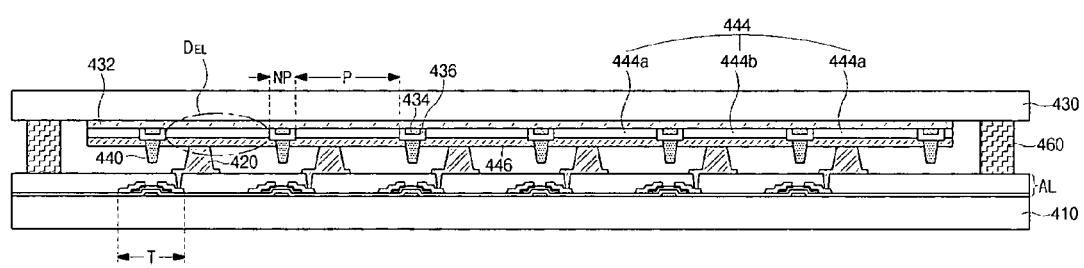
FIG. 7 is a schematic cross-sectional view of a dual panel type organic EL display device according to another embodiment of the present invention.

FIG. 7 is a schematic cross-sectional view of a dual panel type organic EL display device according to another embodiment of the present invention. In FIG. 7, an organic EL display device includes first and second substrates 410 and 430 attached to each other by a seal pattern 460 in a periphery region with a predetermined space therebetween. The EL display device also includes a plurality of pixel regions P and a non-pixel region NP. The pixel regions P may correspond to minimum regions for image display, and the non-pixel region NP may be the boundary of the pixel regions P.

In addition, the first substrate 410 includes an array element layer AL having a plurality of thin film transistors (TFTs) T, and a plurality of connection electrodes 420 formed on the array element AL. The connection electrode 420 connects to the TFT T and may be formed as a multi-layer including an organic insulating pattern having a predetermined height. Although not shown, the array element layer AL includes gate lines, data lines crossing the gate lines to define the pixel regions P, and power lines crossing one of the gate and data lines. Further, the TFT T may include switching TFT that controls a voltage from the gate and data lines, and driving TFT that controls a brightness using a voltage from a respective the switching TFT and the power line. For instance, the TFT T connected to the connection electrode 420 may be the driving TFT.

Further, the second substrate 430 includes a first electrode 432, an auxiliary first electrode 434, an interlayer 436 and a bank 440. The first electrode 432 may formed directly on the second substrate 430 both in the pixel regions P and the non-pixel region NP. The auxiliary first electrode 434 may be formed on the first electrode 432 within the non-pixel region NP, and the interlayer 436 may cover the auxiliary first electrode 434. The bank 440 may be formed above the auxiliary first electrode 434 and has a predetermined height. In particular, the auxiliary first electrode 434, the interlayer 436 and the bank 440 may be formed in the non-pixel region NP.

The second substrate 430 further includes an organic EL layer 444 and a second electrode 446 formed on the first electrode 432 in the pixel regions P. In particular, the organic EL layer 444 may include red, green and blue EL layers 444a, 444b and 444c. The organic EL layer 444 and the second electrode 446 may be divided by the bank 440. Further, the first electrode 432, the organic EL layer 444 and the second electrode 446 may constitute an organic EL diode $D_{EL}$.

The auxiliary first electrode 434 comprises an opaque metallic material having a lower resistivity than the first electrode 432, preferably, excluding Al-based materials. The bank 440 is formed using a photosensitive material and using the auxiliary first electrode 434 as a mask. Thus, the photosensitive material may be patterned without an additional mask. For instance, light may be irradiated from a backside of the second substrate 430, such that the portion of the photosensitive material corresponding to the auxiliary first electrode 434 is not exposed, thereby forming the bank 440 after a developing process.

Accordingly, a dual panel type organic EL display device and a method of fabricating thereof according to an embodiment of the present invention has several advantages. First, because a dual panel type organic EL display device according to an embodiment of the present invention is a top emission type such that a high aperture ratio is obtained. Second, because an array element layer including thin film transistors and an organic EL diode are independently formed on their respective substrates, disadvantages due to fabrication conditions of organic EL diodes are minimized, thereby improving the overall production yield.

Third, a dual panel type organic EL display device according to an embodiment of the present invention includes an auxiliary first electrode that functions as a black matrix and lowers resistivity of a transparent electrode, and a bank formed by an ink-jet printing, thereby improving display quality. Further, a method of fabricating such an organic EL display device according to an embodiment of the present invention employs a simplified mask process, thereby improving productivity.

It will be apparent to those skilled in the art that various modifications and variations can be made in the dual panel type organic electroluminescent display device and the method of fabricating the same of the present invention without departing from the sprit or scope of the invention. Thus, it is intended that the present invention covers the modifications and variations of this invention provided they come within the scope of the appended claims and their equivalents.

What is claimed is:

1. A method of fabricating an organic electroluminescent display device, comprising:

depositing and patterning a transparent conductive material on a first surface of a first substrate to form a first electrode in a pixel region and a non-pixel region;

depositing and patterning an opaque conductive material on the first surface of the first substrate to form an auxiliary electrode on the first electrode in the non-pixel region;

depositing a first insulating material on the first surface of the first substrate;

using the auxiliary electrode as a mask and irradiating light onto a second surface of the first substrate to pattern the first insulating material to form a bank, the first and second surfaces of the first substrate being opposing surfaces to one another;

forming an organic electroluminescent layer on the first surface of the first substrate, the organic electroluminescent layer being in the pixel region surrounded by the bank; and forming a second electrode on the first surface of the first substrate, the second electrode corresponding to the organic electroluminescent layer.

2. The method according to the claim 1, wherein the first insulating material includes a photosensitive organic material.

3. The method according to the claim 2, wherein the photosensitive organic material is a positive type such that a portion after being irradiated by light is removed by a developing process.

4. The method according to the claim 1, further comprising forming an interlayer on the first surface of the first substrate before the step of depositing the first insulating material, the interlayer covering the auxiliary electrode.

5. The method according to claim 4, wherein the step of forming the interlayer includes depositing a second insulating material on the first surface of the first substrate, the first and second insulating materials being different from one another.

6. The method according to claim 1, wherein the first electrode includes one of indium-tin-oxide (ITO), indium-zinc-oxide (IZO) and indium-tin-zinc-oxide (ITZO).

7. The method according to the claim 1, wherein the auxiliary electrode includes one of molybdenum (Mo), tungsten (W), and chromium (Cr).

8. The method according to the claim 1, wherein the auxiliary electrode has a resistivity lower than a resistivity of the first electrode.

9. The method according to the claim 1, wherein the forming of the organic electroluminescent layer includes printing red, green and blue emission materials in the pixel region using an ink-jet printing apparatus.

10. The method according to the claim 1, further comprising forming a second electrode material on an entire surface of the bank and removing a portion of the second electrode material covering the bank before the step of forming the second electrode.

11. The method according to claim 1, further comprising forming an array element having a thin film transistor on a second substrate and a connection electrode on the array element, the connection electrode being electrically connected to the thin film transistor.

12. The method according to the claim 11, wherein the array element includes a gate line, a data line and a power line, the thin film transistor includes a gate electrode, a source electrode connected to the power line, and a drain electrode connected to the connection electrode.

13. A method of fabricating a substrate for an organic electroluminescent display device, comprising:

forming a first electrode on a substrate in a pixel region and a non-pixel region, the first electrode including a first conductive material;

forming an auxiliary electrode on the first electrode in the non-pixel region, the auxiliary electrode including a second conductive material and contacting the first electrode, the first and second conductive materials being different from one another;

forming a bank corresponding to the auxiliary electrode, the bank surrounding the pixel region;

forming an organic electroluminescent layer on the first electrode, the organic electroluminescent layer in the pixel region surrounded by the bank; and forming a second electrode on the organic electroluminescent layer, the second electrode corresponding to the organic electroluminescent layer.

14. The method according to claim 13, further comprising forming an interlayer in the non-pixel region, the interlayer covering the auxiliary electrode.

15. The method according to claim 13, wherein the bank is formed of an photosensitive insulating material.

16. The method according to claim 15, wherein forming the bank includes depositing the photosensitive insulating material on a first surface of the substrate; and patterning the photosensitive insulating material by using the auxiliary electrode as a mask and irradiating light onto a second surface of the substrate, the first and second surfaces being opposing surfaces to one another.

17. The method according to claim 13, wherein the step of forming the organic electroluminescent layer includes printing an organic emission material in the pixel region using an ink-jet printing apparatus.

18. An organic electroluminescent display device, comprising:

a first electrode of a transparent conductive material on a first substrate in a pixel region and a non-pixel region;

an auxiliary electrode contacting the first electrode in the non-pixel region, the auxiliary electrode including an opaque metallic material;

a bank of an insulating material corresponding to the auxiliary electrode, the bank surrounding the pixel region;

an organic electroluminescent layer in the pixel region surrounded by the bank; and a second electrode on the organic electroluminescent layer, the second electrode corresponding to the organic electroluminescent layer.

19. The organic electroluminescent display device according to claim 18, further comprising an interlayer between the auxiliary electrode and the bank, the interlayer covering the auxiliary electrode in the non-pixel region.

20. The organic electroluminescent display device according to claim 18, wherein the bank has a first width near the first substrate being larger than a second width further away from the first substrate.

21. The organic electroluminescent display device according to claim 18, wherein the auxiliary electrode has a resistivity lower than a resistivity of the first electrode.

22. The organic electroluminescent display device according to claim 18, wherein the bank includes a photosensitive insulating material.

23. The organic electroluminescent display device according to claim 18, further comprising:

an array element having a thin film transistor on a second substrate, the first and second substrates spaced apart from each other; and a connection electrode on the array element, the connection electrode being electrically connected to the thin film transistor and to the second electrode.

* * * * *